Aug. 22, 1961

R. H. ARTHUR 2,997,680

SOLDERLESS PRINTED CIRCUIT CONNECTORS

Filed March 28, 1957

INVENTOR
RONALD H. ARTHUR
BY Thomas S. Ross
Joseph R. Spalla
ATTORNEYS 2,997,680

SOLDERLESS PRINTED CIRCUIT CONNECTORS

Ronald H. Arthur, West Hartford, Conn., assignor to Royal McBee Corporation, Port Chester, N.Y., a corporation of New York Filed Mar. 28, 1957, Ser. No. 649,097
4 Claims. (Cl. 339—17)

This invention relates to solderless terminal connectors; more particularly to solderless connectors particularly suitable for use with printed circuit panels; and specifically to solderless printed circuit terminal connectors having, in combination with printed circuit panels, receptacles adapted to mechanically grip and electrically connect external wiring to the printed circuit panels.

Printed circuit panels are generally employed in small compact units wherein space is at a premium, and in units designed for long maintenance free service. Printed circuit panels, as is well known, consist of conductive films deposited in desired patterns on plates of plastic or ceramic insulating material. In order to connect printed circuit panels to power sources or to each other, conventional wiring is necessary.

The printed circuits on a panel are presently connected to outside leads in a variety of ways. One way is to have the printed circuits terminate in enlarged areas located over holes in the panel whereby outside leads may be connected to the printed circuits through taper tips or nuts and screws. Another way is to imbed metal inserts in the printed circuit panels having eyelet portions which project from the plane of the panel, and thereafter apply the conductive material to the panel over the base portion of the metal eyelets. Outside leads may then be connected to the eyelet as by soldering, by nuts and screws or by providing the outside leads with special endings which may be inserted in the eyelets.

Soldering in most instances, other than the time required by a skilled technician to make good connections, is unsatisfactory because of the deleterious effects of heat on the plastic or ceramic panels presently in use. Employing nuts and screws or special lead endings such as taper pins is also unsatisfactory from the standpoint of time, materials and space. Further all of the above enumerated methods are prone to develop faulty and unreliable connections under conditions of shock and vibration.

The instant invention obviates the disadvantages enumerated above in providing a connector construction which enables positive and permanent connections between outside leads and a printed circuit to be rapidly and easily made by unskilled personnel. The novel construction takes the form of a hollow rivet which enables the connector to be securely attached, both mechanically and electrically, to the printed circuits on a printed circuit panel and, in addition, by means of deformable receptacles integral with the connector, enables the secure attachment, both mechanically and electrically, of outside leads to the connector and to the printed circuit.

An object of the invention therefore is to provide a simple and inexpensively manufactured terminal connector for connecting leads to printed circuits.

Another object of the invention is the provision of a connector which will enable rapid and reliable connections of outside leads to printed circuits to be made by unskilled personnel in a minimum of space.

Still another object of the invention is the provision of a printed circuit terminal connector adapted for use with any wire size or printed circuit panel thickness.

A further object of the invention is the provision of a solderless connector for connecting outside leads to printed circuits.

Other objects and many of the attendant advantages of this invention will be readily appreciated as the same becomes better understood by reference to the following detailed description when considered in connection with the accompanying drawings in which like reference numerals designate like parts throughout the figures thereof and wherein.

Figures 1, 2, 3, 4, 5, 6, 7, 8:
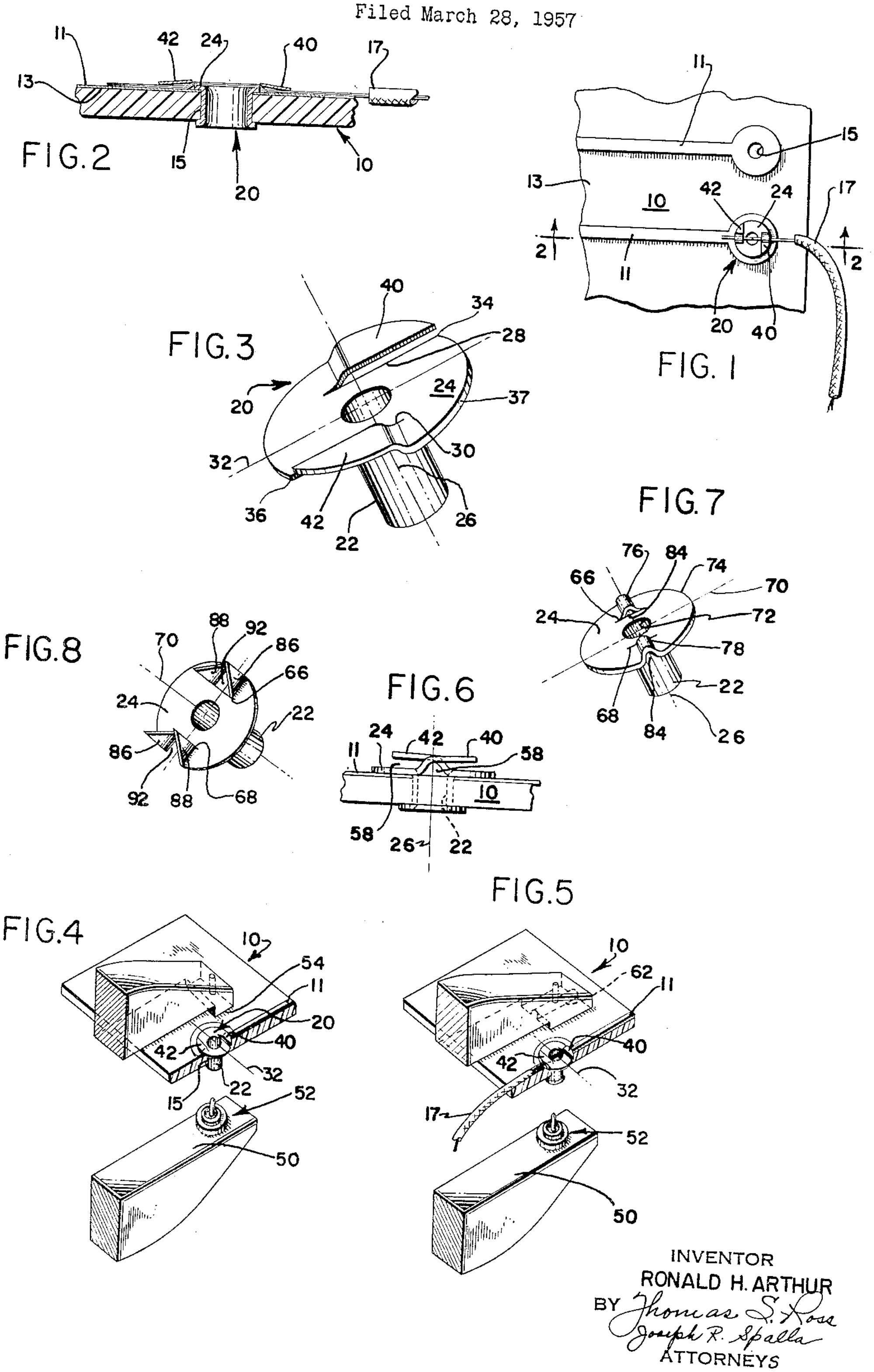
FIG. 1 is a fragmentary plan view of a printed circuit panel with an outside lead connected thereto through a connector in accordance with the invention.
FIG. 2 is a cross sectional view of a printed circuit panel taken along lines 2—2 of FIG. 1.
FIG. 3 is a perspective view of a preferred form of connector in accordance with the invention.
FIGS. 4 and 5 are perspective views of the nose ends of plier like tools employed in fastening the connector to the printed circuit panels and the wire leads to the connector and printed circuits.
FIG. 6 is a side view of a panel mounted connector before insertion of an outside lead.
FIG. 7 is a perspective view of another form of connector in accordance with the invention; and, FIG. 8 is a perspective view of still another form of connector in accordance with the invention.

Referring now to the drawings wherein like reference characters designate like or corresponding parts throughout the several views, there is shown in FIG. 1 a panel 10 fabricated from a suitable plastic or ceramic insulating material. As is understood in the printed circuit art conductive films 11 are deposited on one or both surfaces 13 of the panel in desired patterns. As seen in FIGS. 1 and 2 the conductive films or printed circuits 11 are terminated over holes 15 bored through the panel. In order to connect outside leads 17 securely to the printed circuit, a connector generally designated by reference numeral 20, as will be disclosed with particular reference to FIG. 3 is adapted to be inserted into the hole 15 and secured to the panel 10 and is thereafter adapted to lock the outside leads in intimate contact with the connector as well as with the printed circuit itself.

Referring to FIG. 3, wherein is shown a preferred embodiment, there is depicted the solderless connector generally designated by reference numeral 20 in FIGURES 1 and 2. The connector is fabricated from a suitable conducting material such as brass or the like. The hardness of the material employed will depend on the size of the connector and the wire size of the leads to be connected to the printed circuit panel. In practice the material should be sufficiently ductile so that when crimped or crushed it will form about the lead wires 17 without cutting them.

The connectors are formed as will be understood by those skilled in the metal forming art by suitable dies. The connector 20, as seen in FIG. 3, after forming, comprises a hollow cylindrical body 22 whose outer diameter is substantially equivalent to the diameter of the hole or holes 15 in the printed circuit panel and whose length is somewhat longer than the thickness of the printed circuit panel. The upper end of the tubular body is flared into a platform 24 which occupies a plane perpendicular to the axis 26 of the tubular body. In the preferred embodiment the platform 24 has two straight slits 28 and 30 on opposite sides of and parallel to a diameter 32 thereof. The slits extend from diametrically opposite points 34 and 36 on the peripheral edge 37 of the platform, predetermined distances beyond a diametral line perpendicular to the slits whereby partial segments 40 and 42 outward of the slits may be bent along lines perpendicular to the slit ends at an acute angle away from the plane of the platform.

Referring to FIGS. 4 and 5 the body portion 22 of the connector 20 is placed in the hole 15 in the printed circuit panel with the underside of the platform resting on the printed circuit 11. Thereafter as shown in FIG. 4, a tool in the form of a pliers is utilized to secure the connector to the panel. One jaw surface 50 of the tool is provided with a die 52 adapted to flare the lower end of the tubular body. The other jaw surface takes the form of a rectangular die 54. As is apparent from FIG. 4 the connector 20 is gripped between the jaws of the tool with the rectangular die 54 against the platform 24 within the rectangular space between the offset partial segments 40 and 42 and with the die 52 against the lower open end of body 22. Applied pressure causes the lower end of the body to flare out in the manner of a rivet as seen in FIG. 2 thereby mechanically and electrically securing the connector 20 to the panel 10; the latter through contact of the underside of the platform with the printed circuit 11. After mounting in the above described fashion it is apparent that wire receptacles 58 (FIG. 6) are formed between the offset partial segments 40 and 42 and the printed circuit panel 10. After placing and securing the connectors 20, which are oriented in any desired direction in accordance with the desired direction of eventual wire insertion, lead wires 17 are inserted in the receptacles 58. Thereafter another plier tool, also shown in operative position in FIG. 5, is utilized to secure an outside lead 17 to the connector and printed circuit. The tool shown has one jaw similar to the jaw 50 of FIG. 5. Its other jaw surfaces has a concave semi-cylindrical groove 62 cut therein whereby, when the tool is placed over the platform perpendicular to the diametral line 32, and pressure is applied, the offset partial segments 40 and 42 will be crushed or crimped down and about the mounted wire 17 as shown in FIGS. 1 and 2. While two tools have been described it is to be understood that only the one shown in FIG. 5 may be employed to simultaneously secure the connector 20 to the printed circuit panel 10 and to lock the wires 17 in intimate contact to the connector 20 and panel 10.

Referring to FIG. 7 there is shown another embodiment of a connector which as hereinbefore described with reference to FIG. 3 comprises a tubular body 22 and a platform 24 adapted to be secured to a printed circuit panel 10 in the manner of a rivet. In this embodiment the platform is provided with two straight slits 66 and 68 on opposite sides of and parallel to a diameter 70 of the platform. The slits are intermediate the inner wall 72 of the tubular body and the peripheral edge 74 of the platform whereby peripheral sections 76 and 78 of the platform 24 outward of the slits may be bent away from the plane of the platform along lines perpendicular to the ends of the slits to form after mounting on a printed circuit panel receptacles or channels 84. The discs employed to produce the connector shown in FIGURE 7 are designed to draw form portions 76 and 78 thus stretching and thinning them thereby to prevent deformation of the platform 24.

FIG. 8 is a still further modification of a connector embodying the present invention and similarly comprises a hollow cylindrical body 22 and a platform 24. The platform is slitted as in FIG. 7 and in addition slitted at an acute angle to said first named slits from one of the ends thereof out to the peripheral edges of the platform whereby triangular sections 86 and 88 may be bent up along lines perpendicular to the ends of said first named slits and perpendicular to the plane of the platform thereby to form receptacles or channels 92 into which wires may be inserted. As is obvious plier tools (not shown) having suitably shaped upper jaw surfaces are necessary to properly crush or crimp the offset sections 76 and 78 of FIG. 7 and 86 and 88 of FIG. 8 down about the wires to be secured to the printed circuit panels.

From the foregoing it may be seen that with the instant invention the space required in a direction perpendicular to the surface of the printed circuit panel is very small as compared to conventional types of printed circuit connectors. Additionally no special end of wire terminals are required and even tinning of the wire endings is unnecessary. Further it is apparent that with dimensional variations of the connector or with variations of the wire grips the instant invention is susceptible of accommodating all standard wire sizes, all printed circuit panel thicknesses, and multiple connections, i.e. more than one wire may be inserted in the receptacles.

Many other variations of the method of forming the platform to grip wires are possible and the platform may be so cut that a plurality of wires may be connected thereto. It is to be understood, therefore, that the foregoing disclosure relates to only a few preferred embodiments of the invention and that it is intended to cover all changes and modifications of the examples of the invention herein chosen for the purposes of the disclosure, which do not constitute departures from the spirit and scope of the invention.

The invention claimed is:

1. As an article of manufacture a solderless connector adapted to connect wire terminals to printed circuit panels having printed circuits terminating over holes in said printed circuit panels, said connector comprising a tubular body portion and a flanged head portion lying in a plane perpendicular to the axis of said body portion, said body portion being adapted to be inserted in a hole and riveted to the panel, slits in said flanged head portion parallel to and on opposite sides of a diametral line of said head portion, and sections of said flanged portion outwardly of said slits being offset from the plane of said head portion.

2. In combination with a printed circuit panel having at least one circular hole of predetermined diameter bored therethrough, said panel having a printed circuit surrounding said hole opening, a terminal connector adapted for insertion in said hole comprising a tubular sleeve having an annular flange perpendicular to the axis of said sleeve at one end, said other end being adapted to be flared after insertion of said tubular sleeve in said hole, and offset sections in said flange bounded by portions of the periphery of the flange and slits along chords on opposite sides of a diametral line of said flange, said slits extending to the periphery of said flange whereby wires placed between said offset portions and the printed circuit panel may be mechanically and electrically secured to the printed circuit panel.

3. In combination with a printed panel having at least one circular hole of predetermined diameter bored therethrough, said panel having a printed circuit surrounding said hole opening, a terminal connector in said hole mechanically secured to said panel and in electrical contact with said printed circuit, said terminal connector comprising a tubular sleeve having an annular flange perpendicular to the axis of said sleeve at one end, said other end adapted to be flared after insertion of said sleeve into said hole whereby said connector is secured to said panel and said flange contacts said printed circuit, and offset sections in said flange forming wire receptacles between said offset sections and said printed circuit, said offset sections being formed by cutting said flange predetermined distances along lines parallel to and on opposite sides of a diametral line, and thereafter by bending said flange portions outwardly of said cuts away from the plane of the flange whereby wire terminals may be placed in the receptacles so formed so as to be mechanically and electrically secured to said panel between said offset portions and the printed circuit on said panel.

4. As an article of manufacture, a solderless connector adapted to connect wire terminals to printed circuit panels having printed circuits terminating over holes in said printed circuit panels, said connector comprising a tubular body portion and a flanged head portion lying in a plane perpendicular to the axis of said body portion, said body portion being adapted to be inserted in a hole and riveted to said panel, slits in said flanged head portion parallel to and on opposite sides of a diametral line of said head portion, said slits having one end extending to the periphery of said flanged head portion, and sections of said flanged head portion outwardly of said slits being offset from the plane of said flanged head portion.

References Cited in the file of this patent

UNITED STATES PATENTS

| | | |
|---|---|---|
| 1,517,770 | Ziegler | Dec. 2, 1924 |
| 1,813,154 | Franz | July 7, 1931 |
| 1,971,809 | Bjorndal | Aug. 28, 1934 |
| 2,214,151 | Wagar | Sept. 10, 1940 |
| 2,593,479 | Nieter | Apr. 22, 1952 |
| 2,913,634 | Scoville | Nov. 17, 1959 |

FOREIGN PATENTS

| | | |
|---|---|---|
| 649,254 | Great Britain | Jan. 24, 1951 |
| 686,957 | France | Apr. 22, 1930 |